United States Patent
Ishimaru et al.

(10) Patent No.: US 7,659,605 B2
(45) Date of Patent: Feb. 9, 2010

(54) COF BOARD

(75) Inventors: Yasuto Ishimaru, Osaka (JP); Hirofumi Ebe, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/232,883

(22) Filed: Sep. 25, 2008

(65) Prior Publication Data

US 2009/0096069 A1    Apr. 16, 2009

(30) Foreign Application Priority Data

Oct. 10, 2007   (JP) .............................. 2007-264797

(51) Int. Cl.
*H01L 23/495* (2006.01)
(52) U.S. Cl. ...................... 257/666; 257/690
(58) Field of Classification Search .................. 257/666
See application file for complete search history.

(56) References Cited

U.S. PATENT DOCUMENTS 6,559,524 B2 * 5/2003 Seko ........................... 257/673

| | | | |
|---|---|---|---|
| 2005/0139371 A1 | 6/2005 | Ishimaru et al. | |
| 2007/0013056 A1* | 1/2007 | Lee et al. | 257/723 |
| 2007/0023876 A1* | 2/2007 | Nakamura et al. | 257/666 |

FOREIGN PATENT DOCUMENTS

JP    2005-183465    7/2005

* cited by examiner

*Primary Examiner*—W. David Coleman
*Assistant Examiner*—Christine Enad
(74) *Attorney, Agent, or Firm*—Jean C. Edwards, Esq.; Akerman Senterfitt

(57) ABSTRACT

A COF board includes an insulating layer, and a terminal portion formed on the insulating layer. The terminal portion includes a first lead extending in a longitudinal direction, and a second lead extending in the longitudinal direction, and having a smaller length in the longitudinal direction than a length of the first lead in the longitudinal direction. The first leads are arranged in spaced-apart relation in a direction perpendicular to the longitudinal direction. The second leads are arranged in the direction perpendicular to the longitudinal direction to be interposed between the mutually adjacent first leads such that, when the mutually adjacent first leads are projected in an adjacent direction thereof, overlap portions where the second leads overlap with the first leads and non-overlap portions where the second leads do not overlap with the first leads are formed. Dummy leads are provided at the non-overlap portions.

4 Claims, 3 Drawing Sheets

(a)

(b)

(c)

(d)

(e)

COF BOARD

CROSS-REFERENCE TO RELATED APPLICATION

The present application claims priority from Japanese Patent Application No. 2007-264797, filed on Oct. 10, 2007, the content of which is hereby incorporated by reference in its entirety.

BACKGROUND OF THE INVENTION

1. Field of the Invention

The present invention relates to a COF board and, more particularly, to a COF board for mounting an electronic component.

2. Description of the Related Art

On a COF board, an electronic component such as a semiconductor element (an IC chip and the like) is nakedly mounted (bare-chip mounted) without being contained in a package by a COF (Chip on film) method. The COF board is mounted on various electronic equipment. The COF board typically includes an insulating base layer, and terminal portions formed thereon to be connected to the connection terminals of the electronic component.

As electronic equipment has been increasingly reduced in thickness, length, and width in recent years, a higher density has been required not only of an electronic component, but also of the terminal portions of a COF board.

To satisfy such a requirement, it is proposed that, e.g., terminal portions each including a shorter lead and a longer lead are formed at the end portions of belt-like conductors of a wired circuit board (see, e.g., Japanese Unexamined Patent No. 2005-183465). A plurality of the shorter leads extend in a direction in which the belt-like conductors extend, and are arranged in spaced-apart relation in a direction perpendicular to the extending direction thereof (widthwise direction). A plurality of the longer leads are arranged between the mutually adjacent shorter leads in spaced-apart relation in the widthwise direction. The terminal portions proposed in Japanese Unexamined Patent No. 2005-183465 are formed in an alternating and staggered arrangement (a two-row checker pattern), wherein the end portions of the shorter leads, and the end portions of the longer leads along the widthwise direction.

SUMMARY OF THE INVENTION

The terminal portions of the COF board may be formed by electrolytic plating in an additive method or the like by precipitating a metal in a plating solution in which the COF board is dipped.

However, in the formation of the terminal portions in the wired-circuit board proposed in Japanese Unexamined Patent No. 2005-183465, the pattern density with respect to the plating solution at a longer terminal end portions is lower than that at a shorter terminal end portions and the longer leads except for the longer terminal end portions. That is, density unevenness of the leads with respect to the plating solution are caused, so that the concentration of metal ions in the plating solution is higher in the vicinities of the longer terminal end portions than in the vicinities of the shorter terminal end portions. Accordingly, the metal is precipitated in a larger amount at the longer terminal end portions than at the shorter terminal end portions, so that the longer terminal end portions are thicker than the shorter terminal end portions. When a semiconductor element is mounted on such terminal portions, a gap is easily caused between the thinner shorter terminal end portions and the connection terminal of the semiconductor element. This leads to defective connection to cause degradation of connection reliability.

It is an object of the present invention to provide a COF board which can be increased in density, and also has high connection reliability.

A COF board of the present invention includes an insulating layer, and a terminal portion formed on the insulating layer, and electrically connected to an electronic component, wherein the terminal portion includes a first lead extending in a longitudinal direction, and a second lead extending in the longitudinal direction, and having a length in the longitudinal direction smaller than a length of the first lead in the longitudinal direction, a plurality of the first leads are arranged in spaced-apart relation in a direction perpendicular to the longitudinal direction, a plurality of the second leads are arranged in the direction perpendicular to the longitudinal direction to be interposed between the mutually adjacent first leads such that, when the mutually adjacent first leads are projected in an adjacent direction thereof, overlap portions where the second leads overlap with the first leads and non-overlap portions where the second leads do not overlap with the first leads are formed, and dummy leads are provided at the non-overlap portions.

In the COF board of the present invention, it is preferable that the terminal portion is formed by electrolytic plating.

In the COF board of the present invention, it is preferable that a length of each of the dummy leads in the direction perpendicular to the longitudinal direction is smaller than or the same as a length of the second lead in the direction perpendicular to the longitudinal direction.

In the COF board of the present invention, it is preferable that a length of each of the dummy leads in the longitudinal direction is larger than a spacing between the dummy lead and the second lead in the longitudinal direction.

In the COF board of the present invention, the terminal portion includes the first lead, and the second lead having the length in the longitudinal direction smaller than the length of the first lead in the longitudinal direction. The plurality of first leads are arranged in spaced-apart relation in the direction perpendicular to the longitudinal direction. The plurality of second leads are arranged in the direction perpendicular to the longitudinal direction to be interposed between the mutually adjacent first leads such that, when the mutually adjacent first leads are projected in the adjacent direction thereof, the overlap portion where the second leads overlap with the first leads and the non-overlap portions where the second leads do not overlap with the first leads are formed. As a result, a level difference along the direction perpendicular to the longitudinal direction is formed between the first lead and the second lead to allow an increase in the density of the terminal portions.

On the other hand, the dummy leads are provided at the non-overlap portions of the COF board. Therefore, in the formation of the terminal portions by electrolytic plating, it is possible to prevent density unevenness of the first leads and the second leads with respect to a plating solution, and substantially equalize the concentration of metal ions in the plating solution in the vicinity of the first lead, and the concentration of metal ions in the plating solution in the vicinity of the overlap portion between the dummy lead and the second lead. This allows the first lead and the second lead to have equal thicknesses. As a result, it is possible to unify the thickness of the terminal portion, and obtain excellent connection reliability.

Further, since the dummy leads are provided at the non-overlap portions of the COF board, the COF board can be reinforced when the electronic component is mounted thereon.

DETAILED DESCRIPTION OF THE INVENTION

Figure 1:
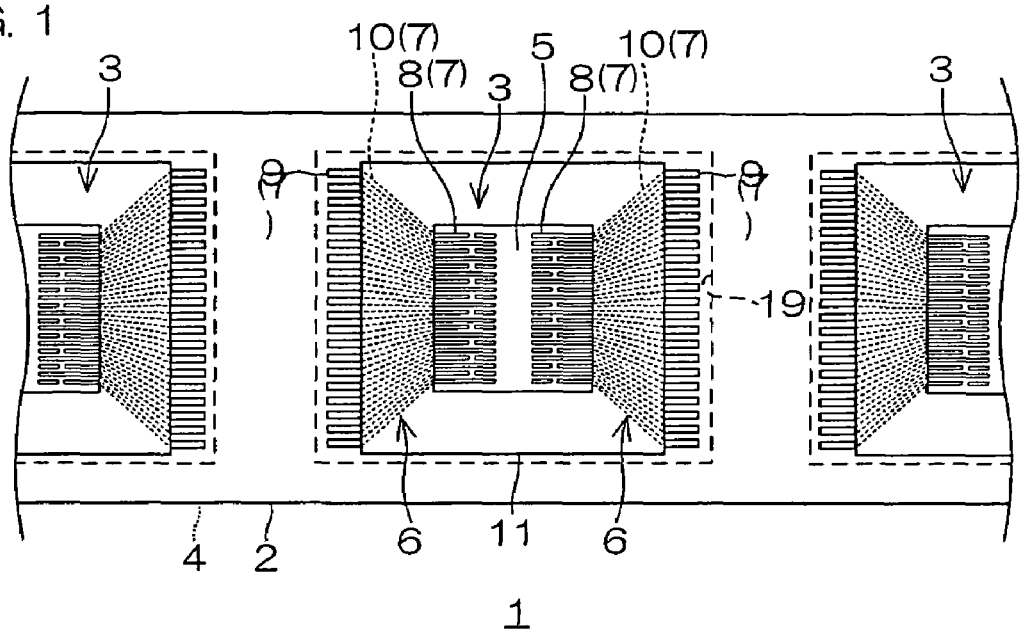
FIG. 1 is a partial plan view showing a COF board according to an embodiment of the present invention.
Figure 2:
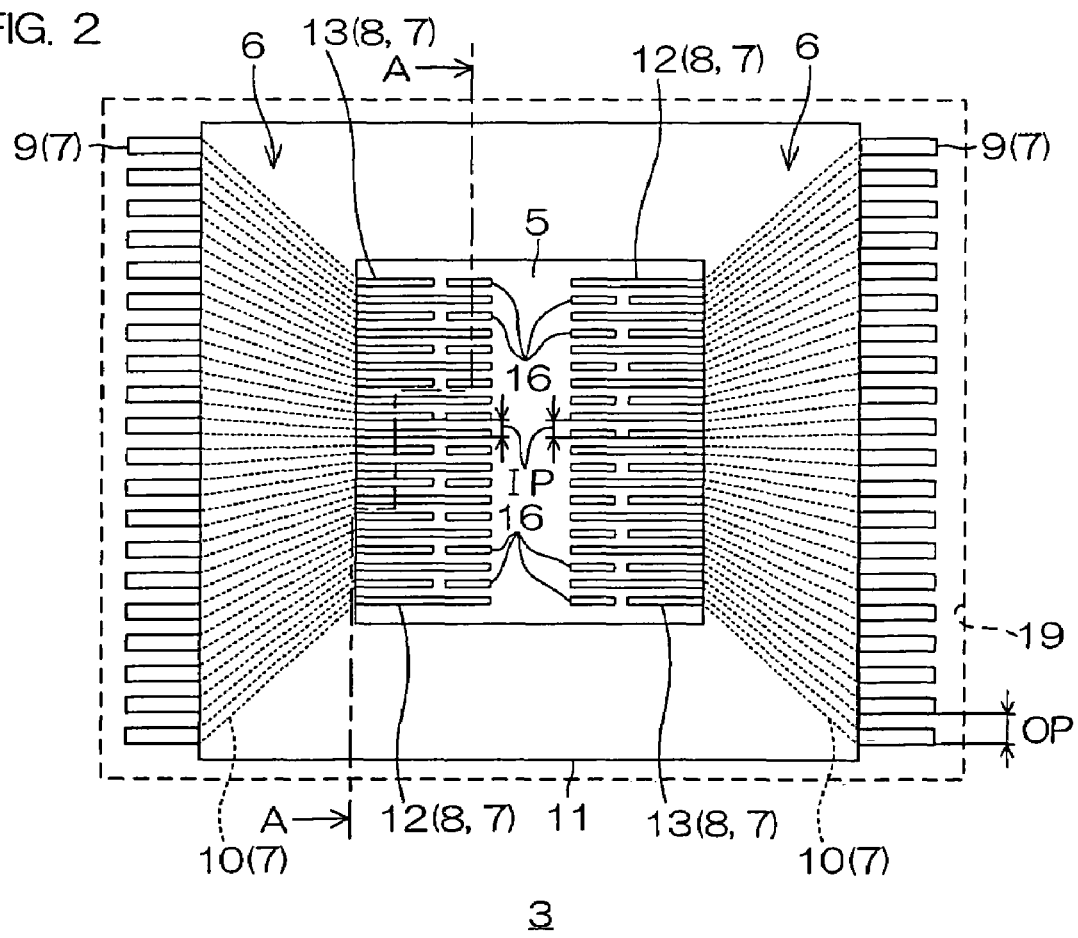
FIG. 2 is an enlarged plan view of a wiring portion of the COF board shown in FIG. 1.
Figure 3:
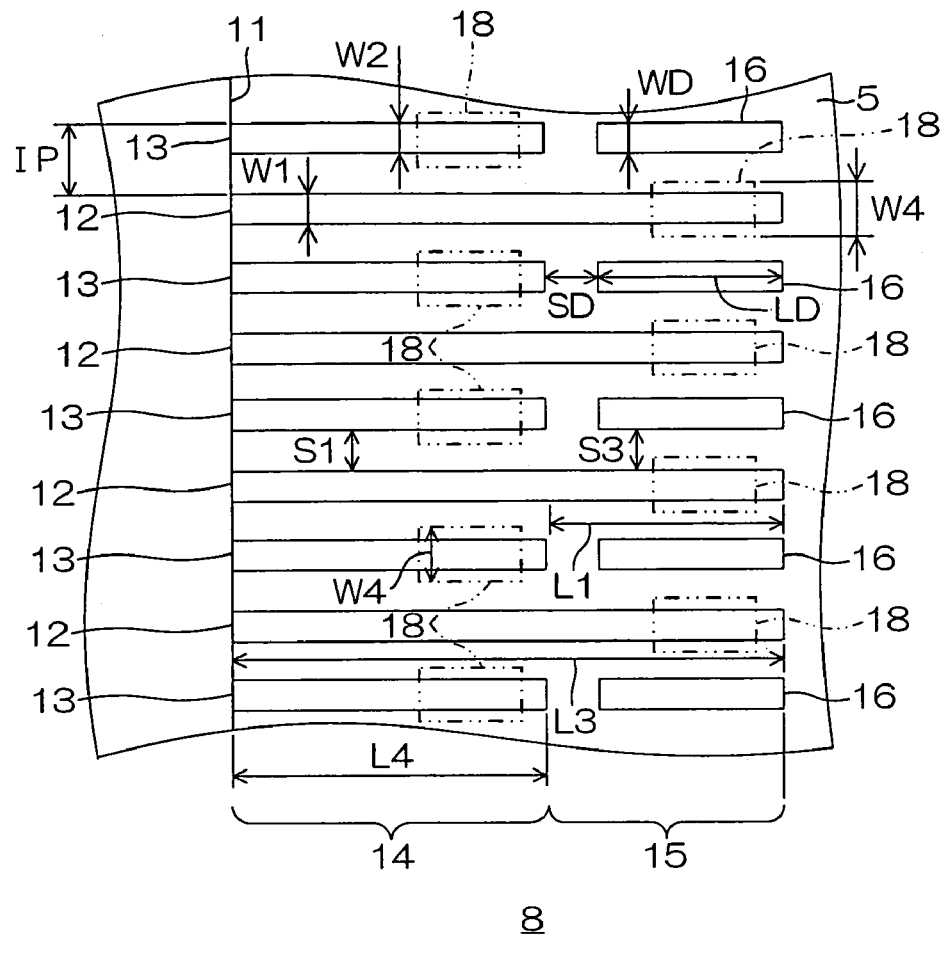
FIG. 3 is an enlarged plan view of inner leads of the wiring portion shown in FIG. 1.
Figure 4:
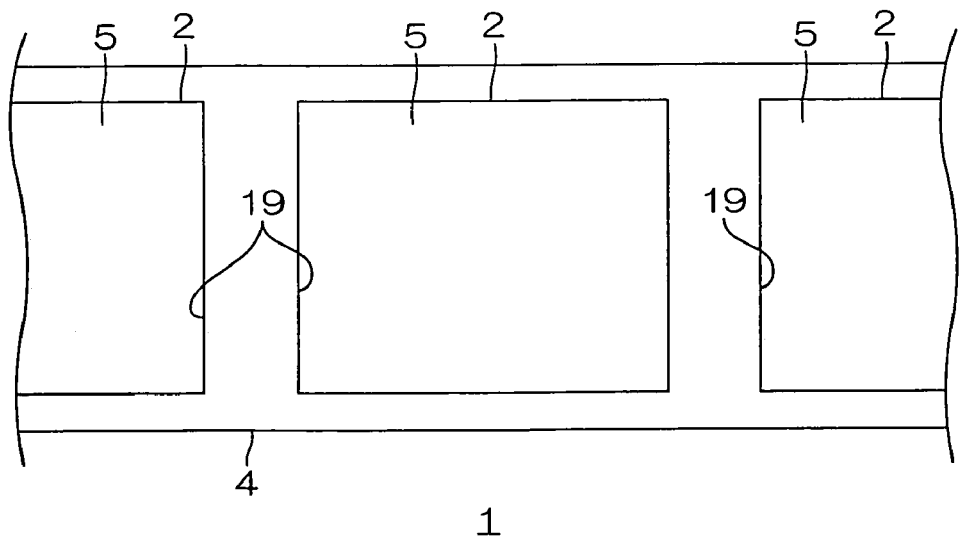
FIG. 4 is a partial bottom view of the COF board shown in FIG. 1.
Figure 5:
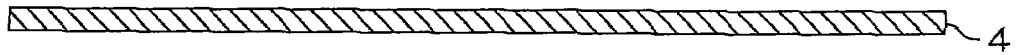
FIG. 5 is a production process view of a producing method of the COF board shown in FIG. 1, which is a cross-sectional view along the line A-A of FIG. 2, (a) showing the step of preparing a reinforcing layer, (b) showing the step of forming an insulating base layer on the reinforcing layer, (c) showing the step of forming conductive patterns and dummy leads, (d) showing the step of forming an insulating cover layer on the insulating base layer, and (e) showing the step of forming an opening in the reinforcing layer.
Figure 5:
Figure 5:
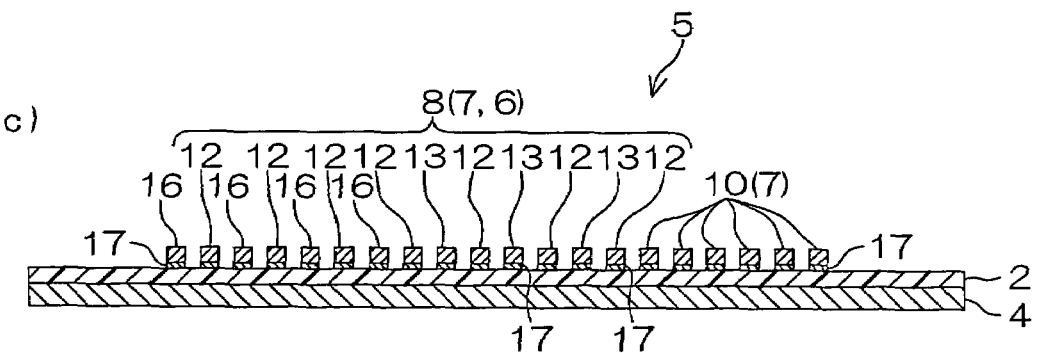
Figure 5:
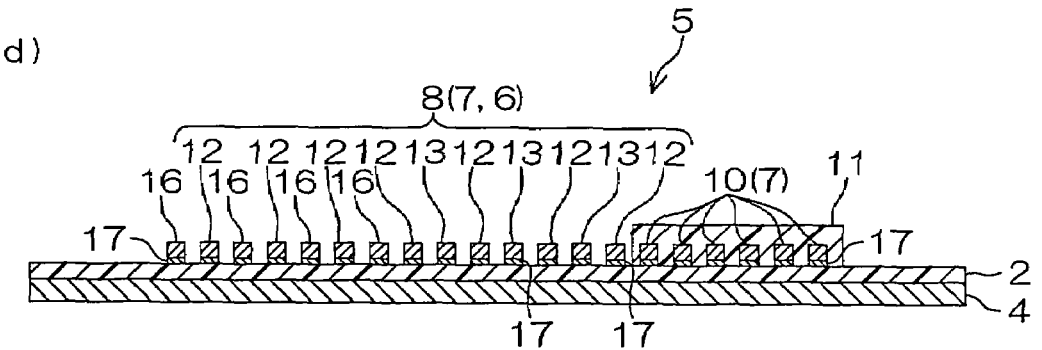
Figure 5:
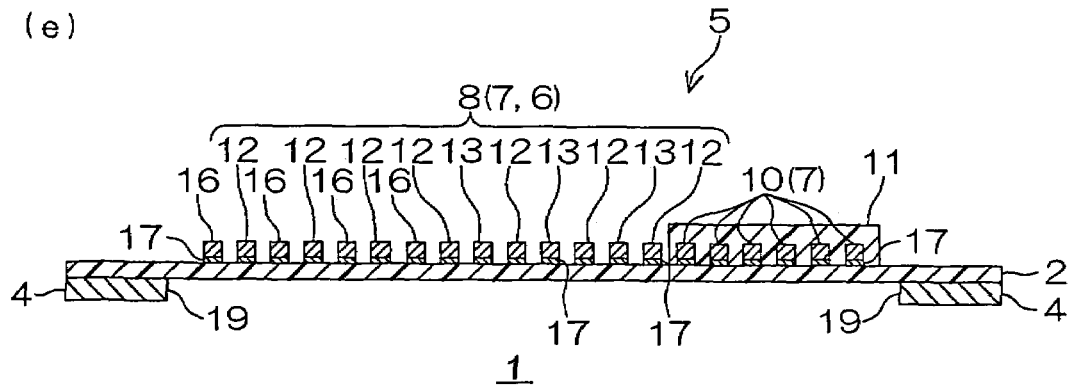

FIG. 1 is a partial plan view showing a COF board according to an embodiment of the present invention. FIG. 2 is an enlarged plan view of a wiring portion of the COF board shown in FIG. 1. FIG. 3 is an enlarged plan view of inner leads of the wiring portion shown in FIG. 1. FIG. 4 is a partial bottom view of the COF board shown in FIG. 1. FIG. 5 is a production process view of a producing method of the COF board shown in FIG. 1, which is a cross-sectional view along the line A-A of FIG. 2.

In FIG. 1, an IC chip not shown is mounted on the COF board 1. The COF board 1 is mounted on various electronic equipment such as a liquid crystal display (a liquid crystal television and the like), and includes an insulating base layer 2 as a belt-like insulating layer continuously extending in a longitudinal direction, a plurality of wiring portions 3 formed on the insulating base layer 2 and provided with conductive patterns 6, and a reinforcing layer 4 (see FIG. 4) formed under the insulating baser layer 2.

The plurality of wiring portions 3 are provided in succession on the surface of the insulating base layer 2 to be spaced apart from each other in a longitudinal direction (which is the same as the longitudinal direction of the COF board 1, and may be hereinafter merely referred to as the "longitudinal direction") of the insulating base layer 2.

In each of the wiring portions 3, as shown in FIG. 2, a mounting portion 5 for mounting (placing) an electronic component such as an IC chip not shown is provided at the center portion thereof. The mounting portion 5 has a generally rectangular shape when viewed in plan view. On both longitudinal sides of the mounting portion 5, the respective conductive patterns 6 are formed.

The conductive patterns 6 are made of a plurality of wires 7 arranged in mutually spaced-apart relation on the surface of the insulating base layer 2. Each of the wires 7 integrally includes an inner lead 8 and an outer lead 9, each as a terminal portion to be electrically connected to the electronic component; and a middle lead 10.

The inner leads 8 face the interior of the mounting portion 5, and are arranged in parallel in a widthwise direction (which is perpendicular to the longitudinal direction, and may be hereinafter merely referred to as the "widthwise direction") of the COF board 1. As shown in FIGS. 2 and 3, the inner lead 8 includes a first inner lead 12 as a first lead, and a second inner lead 13 as a second lead.

A plurality of the first inner leads 12 are each formed in a generally rectangular shape extending in the longitudinal direction when viewed in plan view, and arranged in a spaced-apart relation in the widthwise direction.

A plurality of the second inner leads 13 are each formed in a generally rectangular shape extending in the longitudinal direction when viewed in plan view, and arranged in the widthwise direction to be interposed between the mutually adjacent first inner leads 12. The plurality of second inner leads 13 are arranged to form, when the first inner leads 12 are projected in the widthwise direction (in the adjacent direction of the mutually adjacent first inner leads 12), overlap portions 14 where the second inner leads 13 overlap with the first leads, and non-overlap portions 15 where the second inner leads 13 do not overlap with the first leads are formed. Specifically, the first inner leads 12 and the second inner leads 13 are arranged such that the base end portions (left end portions in FIG. 3, or the peripheral end portion of the mounting portion 5) thereof are disposed at the same position in the longitudinal direction, while the free end portions (right end portions in FIG. 3, or the portions with which bumps 18 on the connection terminals of the IC chip indicated by the imaginary lines and described later come in contact) of the second inner leads 13 are located at positions outside (on the peripheral end portion of the mounting portion 5) of the free end portions (right end portions in FIG. 3, or the portions with which bumps 18 on the connection terminals of the IC chip indicated by the imaginary lines and described later come in contact) of the first inner leads 12. That is, the second inner lead 13 is formed such that the length L4 thereof in the longitudinal direction is smaller than the length L3 of the first inner leads 12 in the longitudinal direction.

As a result, the portions projected from the base end portions of the second inner leads 13 to the free end portions of the second inner leads 13 in the widthwise direction serve as the overlap portions 14, and the portions projected from the free end portions of the second inner leads 13 to the free end portions serve as the non-overlap portions 15. The free end portions of the first inner leads 12 and the free end portions of the second inner leads 13 are formed in an alternating and staggered arrangement along the widthwise direction.

Dummy leads 16 are provided at the non-overlap portions 16.

The dummy leads 16 are each formed in a generally rectangular shape extending in the longitudinal direction when viewed in plan view. At the non-overlap portions 15, the dummy leads 16 are arranged between the mutually adjacent first inner leads 12, and formed to correspond to the respective second inner leads 13. Each of the dummy leads 16 is disposed at a distance SD away from the individual second inner lead 13 in the longitudinal direction to face the interior of the mounting portion 5. The dummy leads 16 are disposed such that the free end surfaces (right end surfaces in FIG. 3) thereof are flush with the free end surfaces (right end surfaces in FIG. 3) of the first inner leads 12 in the widthwise direction.

A width (length in the widthwise direction) W1 of each of the first inner leads 12 and a width (length in the widthwise direction) W2 of each of the second inner leads 13 may be the same or different, and are in a range of, e.g., 5 to 25 μm, or preferably 10 to 20 μm. A distance (spacing in the widthwise direction) S1 between the first inner lead 12 and the second inner lead 13 adjacent to each other is in a range of, e.g., 5 to 35 μm, or preferably 10 to 20 μm. A pitch (i.e., the total length of the width W1 of one of the first inner leads 12 or the width W2 of one of the second inner leads 13 and the distance (spacing in the widthwise direction) S1 between the first inner lead 12 and the second inner lead 13 adjacent to each other) IP of each of the inner leads 8 is in a range of, e.g., not more than 50 μm, or preferably not more than 35 μm, and normally not less than 15 μm.

A length (length in the longitudinal direction from the base end portion to the free end portion) L3 of the first inner lead 12 is in a range of, e.g., 150 μm to 300 μm, or preferably 200 to 250 μm. A length (spacing in the longitudinal direction from the proximal end portion to the free end portion) L4 of the second inner lead 13 is in a range of, e.g., 100 μm to 250 μm, or preferably 150 to 200 μm.

A width WD of the dummy lead 16 is set to be smaller than a width W4 of the bump 18 on the connection terminal of the IC chip described later. That is, the width WD of the dummy lead 16 is set to satisfy the relation given by the following formula (1):

$$WD < W4 \quad (1)$$

When the width WD of the dummy lead 16 is in the range shown above, it is possible to provide a sufficient spacing (space) between the dummy lead 16 and the second inner lead 13 adjacent thereto, and increase the density of the inner leads 8.

The width WD of the dummy lead 16 is set to be smaller than or the same as, e.g., the width W2 of the second inner lead 13, i.e., to satisfy the relation given by the following formula (2).

$$WD \leq W2 \quad (2)$$

When the width WD of the dummy lead 16 is within the range shown above, it is possible to provide a sufficient spacing (space) between the dummy lead 16 and the second inner lead 13 adjacent thereto, and increase the density of the inner leads 8.

More specifically, the width WD of each of the dummy leads 16 is in a range of, e.g., not less than 8 μm, or preferably not less than 10 μm, and normally not more than 15 μm.

The distance (spacing in the longitudinal direction) SD between the dummy lead 16 and the second inner lead 13 is set to satisfy the relation given by, e.g., the following formula (3), or more preferably the relation given by the following formula (4).

$$0\ \mu m < SD \leq 2 \times (\text{Length } L1 \text{ of Non-Overlap Portion}) \quad (3)$$

$$20\ \mu m \leq SD \leq 0.5 \times (\text{Length } L1 \text{ of Non-Overlap Portion}) \quad (4)$$

By setting the distance SD between the dummy lead 16 and the second inner lead 13 within the range shown above, wiring variations can be further reduced.

A length (length in the longitudinal direction) LD of the dummy lead 16 is preferably set to be larger than the distance SD between the dummy lead 16 and the second inner lead 13.

The length LD of the dummy lead 16 is set such that an area (=Length LD of Dummy Lead 16×Width WD of Dummy Lead 16) of the dummy 16 satisfies the relation given by the following formula (5):

$$0.5 \times V1 \leq VD \leq 2.0 \times V1 \quad (5)$$

where V1=(Length L1 of Non-Overlap Portion 15)×(Width W2 of Second Inner Lead 13).

That is, in the non-overlap portions V1 corresponds to the area of the extended portion of the second inner lead 13 obtained by virtually extending the second inner lead 13 toward the interior (right side in FIG. 3) of the mounting portion 5.

Specifically, the length LD of the dummy lead 16 is in a range of, e.g., 50 to 200 μm, or preferably 50 to 150 μm.

By setting the length LD of the dummy lead 16 within the range shown above, it is possible to unify the thickness of the inner lead 8.

As shown in FIG. 2, the outer leads 9 each face the both longitudinal end portions of the wiring portions 3, extend along the longitudinal direction, and are arranged in parallel to be spaced apart from each other in the widthwise direction. A pitch (i.e., the total length of the width (length in the widthwise direction) of the outer lead 9 and the distance (spacing in the widthwise direction) between the two outer leads 9) OP of each of the outer leads 9 is set to, e.g., about 100 to 1000% of the pitch IP of each of the inner leads 8. In other words, the pitch OP of each of the outer leads 9 may be set wider than the pitch IP of each of the inner leads 8, or can also be set as wide as the pitch IP of each of the inner leads 8.

Each of the middle leads 10 is interposed between each inner lead 8 and each outer lead 9 to provide relay therebetween such that the inner lead 8 is continued to the outer lead 9. When the pitch OP of each of the outer leads 9 is set wider than the pitch IP of each of the inner leads 8, the middle leads 10 are arranged in a radial configuration gradually expanding from the inner leads 8 with the narrower pitch toward the outer leads 9 with the wider pitch.

Over a portion where each of the middle leads 10 is disposed, an insulating cover layer 11 such as a solder resist is provided. That is, the insulating cover layer 11 is formed in a generally rectangular shape when viewed in plan view so as to surround the mounting portion 5, and provided so as to cover all the middle leads 10.

In the case where the conductive patterns 6 and the dummy leads 16 are formed by an additive method, metal thin films 17 are interposed between the insulating base layer 2, and the conductive patterns 6 and the dummy leads 16, as shown in FIG. 5(e).

The inner leads 8 and the outer leads 9 each exposed from the insulating cover layer 11 are each formed with a metal plating layer not shown.

As shown in FIG. 4, the reinforcing layer 4 is laminated on the back surface of the insulating baser layer 2. In the reinforcing layer 4, openings 19 are formed at positions opposing the respective wiring portions 3, as shown in FIGS. 1 and 4. Each of the openings 19 is formed by opening the reinforcing layer 4 in a generally rectangular shape when viewed from the bottom side in correspondence to each of the wiring portions 3. The reinforcing layer 4 reinforces the insulating base layer 2 from thereunder.

Next, a description is given to a producing method of the COF board 1 with reference to FIGS. 5(a) to 5(e).

First, as shown in FIG. 5(a), the reinforcing layer 4 is prepared in the method. Examples of a reinforcing material used to form the reinforcing layer 4 include metal materials such as copper and stainless steel. Preferably, stainless steel is used. The thickness of the reinforcing layer 4 is in a range of, e.g., 3 to 100 μm, or preferably 5 to 30 μm.

Next, as shown in FIG. 5(b), the insulating base layer 2 is formed on the reinforcing layer 4.

Examples of an insulating material used to form the insulating base layer 2 include synthetic resins such as a polyimide resin, a polyether nitrile resin, a polyether sulfone resin, a polyethylene terephthalate resin, a polyethylene naphthalate resin, and a polyvinyl chloride resin. Among them, a photosensitive synthetic resin is preferably used, or more preferably a photosensitive polyimide resin is used.

To form the insulating base layer 2, e.g., a photosensitive synthetic resin is coated on the entire surface of the reinforcing layer 4, dried, exposed to light in the foregoing pattern, developed, and then cured as necessary.

The insulating base layer 2 can also be formed in the foregoing pattern by a method in which a solution of the synthetic resin mentioned above is uniformly coated on the entire surface of the reinforcing layer 4, dried, cured by heating as necessary, and then etched, or the like. Otherwise, the insulating base layer 2 can be formed by, e.g., preliminarily forming a synthetic resin into a film in the foregoing pattern, and then sticking the film to the surface of the reinforcing layer 4 via a known adhesive layer.

The thickness of the insulating baser layer 2 thus formed is in a range of, e.g., not more than 50 µm, or preferably not more than 30 µm, and normally not less than 3 µm.

Next, as shown in FIG. 5(c), the conductive patterns 6 and the dummy leads 16 are formed simultaneously.

Examples of a material used to form the conductive patterns 6 and the dummy leads 16 include metal materials (conductive materials) such as copper, nickel, gold, a solder, and an alloy thereof. Preferably, copper is used.

To form the conductive patterns 6 and the dummy leads 16, a known patterning method such as, e.g., an additive method or a subtractive method is used. Preferably, an additive method using electrolytic plating is used.

In the additive method, e.g., the metal thin film 17 is formed first on the entire surface of the insulating base layer 2 by a sputtering method or the like. Then, on the metal thin film 17, a plating resist is formed in a pattern reverse to the conductive patterns 6, and to a pattern of the dummy leads 16. Thereafter, the COF board 1 in the process of the production thereof is dipped in a plating solution of the metal material mentioned above, and electrolytic plating is performed by energizing the dipped COF board 1 to simultaneously form the conductive patterns 6 and the dummy leads 16 on the metal thin film 17 exposed from the plating resist. Thereafter, the plating resist and the portion of the metal thin film 17 where the plating resist is formed are removed.

In the electrolytic plating described above, the dummy leads 16 are formed between the adjacent first inner leads 12. Therefore, it is possible to substantially equalize the concentration of metal ions in the plating solution in the vicinity of the first inner lead 12, and the concentration of metal ions in the plating solution in the vicinity of the dummy leads 16 and non-overlap portion 14 of the second inner leads 13. Accordingly, the difference between the thickness of the first inner lead 12 and that of the second inner lead 13, which is described later, can be set to not more than 2.0 µm.

As a result, the conductive patterns 6 are formed as a pattern of the wires 7 integrally formed with the inner leads 8, the outer leads 9, and the middle leads 10, while the dummy leads 16 are formed at the non-overlap portions 15.

The respective thicknesses of the conductive patterns 6 and the dummy leads 16 thus formed are in a range of, e.g., not less than 5 µm, or preferably 8 to 15 µm. The thickness of the first inner lead 12 and that of the second inner lead 13 are normally the same, or slightly different. When the thickness of the first inner lead 12 and that of the second inner lead 13 are slightly different, the difference therebetween is in a range of, e.g., not more than 2.0 µm, or preferably not more than 1.0 µm. When the thickness difference between the first inner lead 12 and the second inner lead 13 is over 2.0 µm, defective connection may be caused in the connection with the connection terminal of the IC chip.

Next, as shown in FIG. 5(d), the insulating cover layer 11 is formed on the insulating base layer 2 so as to cover the middle leads 10. Examples of an insulating material used to form the insulating cover layer 11 include a synthetic resin such as a solder resist. To form the insulating cover layer 11, e.g., a photosensitive solder resist is formed by a known method which involves exposure to light and development. The thickness of the insulating cover layer 11 thus formed is in a range of, e.g., 5 to 30 µm, or preferably 5 to 20 µm.

Next, a metal plating layer not shown is formed on the surfaces of the inner leads 8 and the outer leads 9 of the respective wires 7. Examples of a metal material used to form the metal plating layer include nickel and gold. The metal plating layer is formed by, e.g., electroless metal plating.

Next, as shown in FIG. 5(e), the openings 19 are formed in the reinforcing layer 4.

To form the openings 19 in the reinforcing layer 4, the portions of the reinforcing layer 4 opposing the wiring portions 3 are opened by a known method such as, e.g., chemical etching (wet etching).

In this manner, the COF board 1 can be obtained.

Next, a description will be given to a mounting (placing) method of IC chips on the COF board 1 obtained by the foregoing process.

First, the IC chips are prepared. In the IC chip, the connection terminals for electrically connecting to the inner leads 8 and the outer leads 9, and the bumps 18 (indicated by the imaginary lines in FIG. 3) formed on the surfaces of the connection terminals are provided, though not shown. In particular, the connection terminals for connecting to the inner leads 8 are formed in a pattern (arrangement) corresponding to the alternating and staggered arrangement of the free end portions (indicated by the imaginary lines) of the first inner leads 12 and the free end portions (indicated by the imaginary lines) of the second inner leads 13, as shown in FIG. 3. The width W4 of the bump 18 on the connection terminal corresponding to the inner lead 8 is in a range of, e.g., 10 to 25 µm, or preferably 15 to 20 µm.

Then, the IC chips are placed on the mounting portions 5 of the COF board 1, and the connection terminals of the IC chips are electrically connected to the inner leads 8 and the outer leads 9 via the bumps 18.

In this manner, the IC chips can be mounted on the COF board 1.

In the COF board 1, the first inner leads 12 and the second inner leads 13 are formed in the alternating and staggered arrangement along the widthwise direction. This allows an increase in the density of the inner leads 8.

On the other hand, the dummy leads 16 are provided at the non-overlap portions 15 of the COF board 1. Therefore, in the formation of the inner leads 8 by plating in an additive method or the like, it is possible to prevent density unevenness of the inner leads 8 with respect to a plating solution, and equalize the concentration of metal ions in the plating solution in the vicinity of the first inner lead 12, and the concentration of metal ions in the plating solution in the vicinity of the dummy leads 16 and the overlap portions of the second inner leads 13. This allows the first inner lead 12 and the second inner lead 13 to have equal thicknesses. As a result, it is possible to unify the thickness of the inner leads 8, and obtain excellent connection reliability in the COF board 1.

Further, since the dummy leads 16 are provided at the non-overlap portions 15 in the COF board 1, the mounting portion 5 can be reinforced when the IC chip is mounted.

In the description given above, the first inner leads 12 and the second inner leads 13 are formed in the inner leads 8, and the dummy leads 16 are provided at the non-overlap portions 15 formed with the second inner leads 13. However, it is also possible to, e.g., in addition to the inner leads 8, first outer leads and second outer leads may be found in the outer leads 9 to provide dummy leads at non-overlap portions formed with the second outer leads, though not shown.

In the description given above, the plurality of dummy leads 16 are formed in correspondence to the plurality of second inner leads 13. However, it is also possible to, e.g., form a smaller number (at least one or more) of the dummy leads 16 than the number of the second inner leads 13 without agreement in the number of the dummy leads 16 and that of the second inner leads 13. In this case, portions where the dummy leads 16 are disposed between the adjacent first inner leads 12, and portions where the dummy leads 16 are not disposed between the adjacent first inner leads 12 are regularly or irregularly arranged along the widthwise direction.

In the description given above, the reinforcing layer 4 is formed in the COF board 1. However, it is also possible to, e.g., produce the COF board 1 without forming the reinforcing layer 4, though not shown. In the case where the reinforcing layer 4 is not formed in the COF board 1, the COF board 1 is formed by laminating the insulating base layer 3, the conductive patterns 6, and the insulating cover layer 11 on a known release sheet, and then removing the release sheet.

EXAMPLES

The present invention is described more specifically by showing the examples and the comparative example hereinbelow.

Example 1

A reinforcing layer made of a stainless steel foil having a thickness of 20 μm was prepared (see FIG. 5(*a*)). Then, a solution of a polyamic acid resin was coated on the entire surface of the reinforcing layer, dried, exposed to light, developed, and then cured by heating to form an insulating base layer made of a polyimide resin and having a thickness of 25 μm (see FIG. 5(*b*)).

Then, conductive patterns and dummy leads were simultaneously formed by an additive method.

That is, a chromium thin film having a thickness of 30 nm and a copper thin film having a thickness of 200 nm were formed in this order by a sputtering method to form a metal thin film. Then, on the metal thin film, a plating resist made of a dry film resist was formed in a pattern reverse to the conductive patterns, and to a pattern of the dummy leads. Thereafter, the conductive patterns and the dummy leads were formed on the metal thin film exposed from the plating resist by electrolytic copper plating.

Thereafter, the plating resist and the portion of the metal thin film where the plating resist was laminated were removed so that the conductive patterns were formed as a pattern of wires integrally formed with inner leads, outer leads, and middle leads, and dummy leads (each having a thickness of 10 μm) were formed at non-overlap portions (see FIG. 5(*c*)). The pitch of the inner lead was 30 μm, and the pitch of the outer lead was 100 μm. The length of the first inner lead was 300 μm, and the length of the second inner lead was 150 μm. The other dimensions of the inner leads and the dummy lead were as shown below in Table 1.

Then, a photosensitive solder resist was formed in a predetermined pattern, exposed to light, and developed to form an insulating cover layer in a pattern covering the middle leads.

Thereafter, the portions of the reinforcing layer opposing the wiring portions were opened by chemical etching to form openings in the reinforcing layer, whereby a COF board was obtained.

Examples 2 to 5

COF boards of EXAMPLES 2 to 5 were obtained in the same manner as in EXAMPLE 1 except that the dimensions of the inner leads and the dummy lead were changed as shown below in Table 1 in the formation of the conductive patterns.

Comparative Example 1

A COF board was obtained in the same manner as in EXAMPLE 1 except that the dummy leads were not formed in the formation of the conductive patterns.

TABLE 1

| Examples/Comparative Examples | Dimensions of Terminal Portion (μm) | | | | | | | | | | | |
|---|---|---|---|---|---|---|---|---|---|---|---|---|
| | Width WD of Dummy Lead | Length LD of Dummy Lead | Width W2 of Second Lead | Width W1 of First Lead | Length L1 of Non-Overlap Portion | Spacing SD between Dummy Lead and Second Lead | Area VD of Dummy Lead | Area V1 of Extended Portion | Width W4 of Bump | Thickness T1 of First Lead | Thickness T2 of Second Lead | T1 − T2 |
| Example 1 | 10 | 50 | 10 | 10 | 150 | 50 | 500 | 1500 | 20 | 10.5 | 8.5 | 1.4 |
| Example 2 | 10 | 100 | 10 | 10 | 150 | 20 | 1000 | 1500 | 20 | 9.3 | 8.6 | 0.7 |
| Example 3 | 10 | 160 | 10 | 10 | 180 | 20 | 1600 | 1800 | 20 | 8.7 | 8.9 | −0.2 |
| Example 4 | 20 | 80 | 10 | 10 | 150 | 30 | 1600 | 1500 | 20 | 7.9 | 8.4 | −0.5 |
| Example 5 | 20 | 100 | 10 | 10 | 150 | 50 | 2000 | 1500 | 20 | 7.2 | 8.4 | −1.2 |
| Comparative Example 1 | — | — | 10 | 10 | 150 | — | — | 1500 | 20 | 11.6 | 8.9 | 2.7 |

(Evaluation)

(Connection Test)

IC chips including the connection terminals mentioned above, and the bumps formed on the surfaces thereof were prepared. The width (W4) of the bump on the connection terminal corresponding to the inner lead was 20 μm.

Then, the IC chips were placed on the respective mounting portions of the COF boards obtained in the examples and the comparative example, and the connection terminals of the IC chip were electrically connected to the inner leads and the outer leads via the bumps.

As a result, in EXAMPLES 1 to 5, the connection of the inner lead and that of the outer lead were both excellent.

By contrast, in COMPARATIVE EXAMPLE 1, defective connection was caused in the second inner lead of the inner lead.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A COF board comprising:
an insulating layer; and
a terminal portion formed on the insulating layer, and electrically connected to an electronic component, wherein
the terminal portion comprises a first lead extending in a longitudinal direction, and a second lead extending in the longitudinal direction, and having a length in the longitudinal direction smaller than a length of the first lead in the longitudinal direction,
a plurality of the first leads are arranged in spaced-apart relation in a direction perpendicular to the longitudinal direction,
a plurality of the second leads are arranged in the direction perpendicular to the longitudinal direction to be interposed between the mutually adjacent first leads such that, when the mutually adjacent first leads are projected in an adjacent direction thereof, overlap portions where the second leads overlap with the first leads and non-overlap portions where the second leads do not overlap with the first leads are formed, and
dummy leads are provided at the non-overlap portions.

2. The COF board according to claim 1, wherein the terminal portion is formed by electrolytic plating.

3. The COF board according to claim 1, wherein a length of each of the dummy leads in the direction perpendicular to the longitudinal direction is smaller than or the same as a length of the second lead in the direction perpendicular to the longitudinal direction.

4. The COF board according to claim 1, wherein a length of each of the dummy leads in the longitudinal direction is larger than a spacing between the dummy lead and the second lead in the longitudinal direction.

* * * * *